(12) United States Patent
Matsuzawa (10) Patent No.: US 8,375,963 B2
(45) Date of Patent: Feb. 19, 2013

(54) SUBSTRATE PROCESSING APPARATUS AND SUBSTRATE PROCESSING METHOD

(75) Inventor: Minoru Matsuzawa, Tokyo (JP)

(73) Assignee: Micro Engineering Inc., Tokyo (JP)

( * ) Notice: Subject to any disclaimer, the term of this patent is extended or adjusted under 35 U.S.C. 154(b) by 0 days.

(21) Appl. No.: 13/276,586

(22) Filed: Oct. 19, 2011

(65) Prior Publication Data

US 2012/0090642 A1    Apr. 19, 2012

(30) Foreign Application Priority Data

Oct. 19, 2010  (JP) ................................ 2010-234687

(51) Int. Cl.
*B08B 3/04* (2006.01)

(52) U.S. Cl. ........ 134/142; 134/137; 134/149; 134/153; 134/184

(58) Field of Classification Search .................... None
See application file for complete search history.

(56) References Cited

U.S. PATENT DOCUMENTS

| | | | | |
|---|---|---|---|---|
| 4,640,846 | A * | 2/1987 | Kuo .............................. | 438/782 |
| 6,379,469 | B1 * | 4/2002 | Tanaka et al. ..................... | 134/6 |
| 6,866,723 | B2 * | 3/2005 | Ueda et al. ....................... | 134/33 |
| 6,936,107 | B2 * | 8/2005 | Kitano et al. .................. | 118/676 |
| 2008/0047577 | A1 | 2/2008 | Goto et al. | |

FOREIGN PATENT DOCUMENTS

| | | | |
|---|---|---|---|
| JP | 05-115828 | * | 5/1993 |
| JP | 7088760 | A | 4/1995 |
| JP | 11102885 | A | 4/1999 |
| JP | 2000138148 | A | 5/2000 |
| JP | 2001080476 | A | 3/2001 |
| JP | 2001102292 | A | 4/2001 |
| JP | 2001284206 | A | 10/2001 |
| JP | 2006012412 | A | 1/2006 |
| JP | 2006080315 | A | 3/2006 |
| JP | 2007067080 | A | 3/2007 |
| JP | 2010080924 | A | 4/2010 |
| JP | 2010093191 | | 4/2010 |

OTHER PUBLICATIONS

Machine translation of JP05-115828 by Kobayashi et al., published May 14, 1993.*

* cited by examiner

*Primary Examiner* — Michael Kornakov
*Assistant Examiner* — Ryan Coleman
(74) *Attorney, Agent, or Firm* — Bachman & LaPointe, P.C.

(57) ABSTRACT

A protruding portion (13), which has a central axis coincident with a rotational axis of a table (10), is formed at a center portion of a surface of the table (10). At the time of the surface processing, the table (10) is rotated under a state in which the processing target surface of the substrate (12) is supported horizontally at each of a plurality of parts on the table (10) spaced apart from a base end of the protruding portion (13) toward an outer peripheral end portion of the table (10) by a predetermined distance and at the same distance from a top end of the protruding portion (13). Then, a processing liquid is supplied toward the top end of the protruding portion (13). The processing liquid that has reached the processing target surface of each substrate (12) is then removed outside the table (10) by centrifugal force.

9 Claims, 10 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and substrate processing method for performing surface processing with a processing liquid such as pure water or a chemical liquid with the use of a table which rotates in a horizontal direction under a state in which a substrate such as a semiconductor wafer or a glass substrate is supported.

2. Description of the Related Art

In a photoresist step as one of semiconductor manufacturing steps, generally, a processing target surface of a semiconductor wafer or a glass substrate (hereinafter, simply referred to as "substrate") is applied with a resist, and after being exposed in a predetermined pattern, wetted with a chemical liquid to form a resist pattern. After that, in order to remove a dissolved material of the resist together with a developer from the substrate surface, surface processing such as cleaning the substrate surface with pure water and the like is performed.

To give a specific example, in a processing apparatus including a rotatable table, a center of a vertical shaft of the table and a center of a substrate to be subjected to processing are coincident with each other, and under a state in which the substrate is placed horizontally, a processing liquid such as pure water or a chemical liquid is supplied in the vicinity of a center portion of the table, that is, in the vicinity of a center portion of the substrate. Then, the processing liquid is forced to flow by centrifugal force to be spread on the entire processing target surface of the substrate. Thus, the surface processing is proceeded.

However, in such kind of conventional processing apparatus, due to the characteristics of the centrifugal force, the processing liquid moves at higher speed at a peripheral edge portion of the processing target surface of the substrate rotating on the table, and the moving speed of the processing liquid becomes relatively lower toward the center portion. Therefore, depending on the rotating speed of the substrate, the processing liquid stagnates on the processing target surface. Therefore, there are cases where fluctuations are generated in processing effects of the processing target surface and it takes some time to set processing conditions. Hence, there is a problem in that cleaning effects cannot be enhanced.

In view of enhancing the cleaning effects, there is a method disclosed in Japanese Patent Application Laid-open No. 2006-80315. In this method, while rotating the substrate, a cleaning liquid is radially spread from a center portion of the substrate to form a liquid film to clean the substrate, and then under a state in which a dry region is generated in the center portion of the substrate, the substrate is rotated at the number of revolutions of 1,500 rpm or more. At this time, owing to the centrifugal force, a marginal part of the liquid film corresponding to an outer edge of the dry region expands rapidly in the outer peripheral direction of the substrate.

Further, in the apparatus disclosed in Japanese Patent Application Laid-open No. 2007-67080, a position at which the cleaning liquid is supplied from a cleaning liquid nozzle moves from the center portion toward the peripheral edge of the substrate and a gas is blown toward outside of the substrate to a region on the downstream side with respect to the supply position in the rotating direction of the substrate. With this, a dry region in the surface of the substrate expands rapidly outward even if the substrate is rotated at a low rotating speed that does not cause the cleaning liquid to run wildly, and hence it is possible to perform the cleaning processing without stagnation of the liquid flow at the same radial position.

In the method disclosed in Japanese Patent Application Laid-open No. 2006-80315, similarly to the conventional case, there remains a problem that unevenness and the like remain in the vicinity of the center portion of the processing target surface of the substrate. Further, in the apparatus disclosed in Japanese Patent Application Laid-open No. 2007-67080, there remain problems that condition settings for attaining processing uniformity become complex and the like.

SUMMARY OF THE INVENTION

The present invention has been made to solve the above-mentioned problems, and has a main object to provide a substrate processing technology capable of moving a processing liquid uniformly without stagnation of the processing liquid in the vicinity of a center portion of a processing target surface of a substrate, to thereby perform efficient processing.

In order to solve the above-mentioned problems, the present invention provides a substrate processing apparatus and a substrate processing method.

The substrate processing apparatus according to the present invention includes: a table, which rotates in parallel to a processing target surface of a substrate under a state in which the processing target surface is supported horizontally, the table having the processing target surface provided thereon, toward which a predetermined processing liquid is supplied; a protruding portion, which is formed at a center portion of a surface of the table and has a central axis coincident with a rotational axis of the table; and a plurality of substrate support mechanisms, which are formed on portions of the surface of the table spaced apart from a base end of the protruding portion in an outer peripheral direction of the table by a predetermined distance, for supporting the substrate so that the processing target surface thereof is held horizontally, the plurality of substrate support mechanisms being provided at the same distance from a top end of the protruding portion, in which the predetermined processing liquid, which is supplied vertically downward toward the top end of the protruding portion rotating together with the table, is forced to flow by centrifugal force generated through rotation of the table via the top end of the protruding portion, to thereby cause the predetermined processing liquid to reach processing target surfaces of all of substrates supported by the plurality of substrate support mechanisms, the processing target surfaces including vicinity of center portions of the substrates.

The processing liquid is supplied vertically downward toward the top end of the protruding portion, and reaches each of the processing target surfaces of the plurality of substrates supported at the same distance from the top end of the protruding portion, the processing target surfaces including the vicinity of the center portions of the substrates. Therefore, the processing liquid is not directly supplied on the processing target surface, and further, the processing liquid is forced to flow by the centrifugal force generated through the rotation of the table via the top end of the protruding portion to reach the processing target surface. In this manner, even in the vicinity of the center portion of the processing target surface of the substrate, unevenness of the processing liquid is not generated, and uniformity can be attained in processing results. Further, the processing target surfaces of the plurality of substrates are subjected to processing at the same time, and hence work efficiency is significantly enhanced compared to a case where only one substrate is subjected to processing at a time.

According to an aspect of the present invention, each of the plurality of substrate support mechanisms supports a rear surface with respect to the processing target surface of the substrate in a non-contact manner to the table by Bernoulli effect.

According to another aspect of the present invention, the substrate processing apparatus further includes blocking plates, which are formed on the surface of the table, for receiving one of a flow of the predetermined processing liquid and a flow of air routed via the protruding portion, while blocking one of a flow of the predetermined processing liquid and a flow of air routed via one of adjacent one of the plurality of substrate support mechanisms and a substrate supported by the adjacent one of the plurality of substrate support mechanisms.

Specifically, at least the same number of blocking plates as the plurality of substrate support mechanisms are provided, and the blocking plates are each formed in a space between adjacent ones of the plurality of substrate support mechanisms, and formed radially from the base end of the protruding portion in the outer peripheral direction of the table. With this, with the rotation of the table, the blocking plates produce a blower effect like a fan having radial blades (also referred to as radial fan). As a result, it is possible to cause the processing liquid that has reached the processing target surface of the substrate to move more uniformly and rapidly.

In view of preventing particles from adhering after the surface processing, the substrate processing apparatus further includes a top plate, which is opposed in parallel to the processing target surfaces of the substrates supported by the plurality of substrate support mechanisms each provided between adjacent blocking plates, the top plate being provided on outer end portions of the adjacent blocking plates.

The top plate may be formed into a mesh form to supply the predetermined processing liquid to the opposing processing target surfaces via the top plate.

In view of preventing electrification, each of the top plate and the blocking plates is formed of a conductive member held at a ground potential.

The substrate processing apparatus may further include protruding portion elevating means for causing a position of the top end of the protruding portion to move on the rotational axis of the table so that the protruding portion freely ascends and descends. With such a structure, even when the thickness of the substrate changes, it is possible to flexibly support the substrate thus changed in thickness, and because replacement of the protruding portion or the like is unnecessary, processing efficiency can be improved. Further, by moving the protruding portion upwardly and downwardly, even in a case where the processing target surface corresponds to one side of the substrate and in a case where the processing target surface corresponds to both sides of the substrate, it is possible to support both cases without replacing the protruding portion or taking other measures. Also from this viewpoint, processing efficiency can be improved.

The substrate processing method according to the present invention is a substrate processing method, which is performed by a substrate processing apparatus including: a table, which rotates in parallel to a processing target surface of a substrate under a state in which the processing target surface is supported horizontally; a processing liquid supply mechanism for supplying a processing liquid to the processing target surface; and a protruding portion, which is formed at a center portion of a surface of the table and has a central axis coincident with a rotational axis of the table, the substrate processing method including: supporting the substrate at each of a plurality of parts on the table spaced apart from a base end of the protruding portion in an outer peripheral direction of the table by a predetermined distance and at the same distance from a top end of the protruding portion so that the processing target surface of the substrate is held horizontally; and rotating the table supporting a plurality of substrates and supplying, by the processing liquid supply mechanism, the processing liquid vertically downward toward the top end of the protruding portion of the rotating table, to thereby force the processing liquid to flow by centrifugal force generated through rotation of the table via the top end of the protruding portion and diffuse the processing liquid, and then removing the processing liquid that has reached the processing target surface of each of the plurality of substrates, which includes vicinity of a center portion of the each of the plurality of substrates, by the centrifugal force in the outer peripheral direction of the table.

According to the present invention, the processing liquid is forced to flow by the centrifugal force generated through the rotation of the table to move uniformly on the processing target surfaces of the plurality of substrates without stagnation in the vicinity of the center portions of the processing target surfaces. Thus, it is possible to provide the substrate processing technology capable of performing uniform and efficient processing.

DETAILED DESCRIPTION OF THE PREFERRED EMBODIMENTS

A substrate processing apparatus according to the present invention is an apparatus including a table which rotates in parallel to a processing target surface under a state in which the processing target surface is supported horizontally, the processing target surface corresponding to one surface of a substrate such as a semiconductor wafer or a glass substrate to be subjected to processing such as cleaning and drying, in which, toward the processing target surface on the table, a chemical liquid, a cleaning liquid, or other such liquid (processing liquid) is supplied.

This substrate processing apparatus has main features in a table structure and a method of driving and controlling the table. Hereinafter, examples of embodiments of the substrate processing apparatus are described.

First Embodiment

Figure 1A:
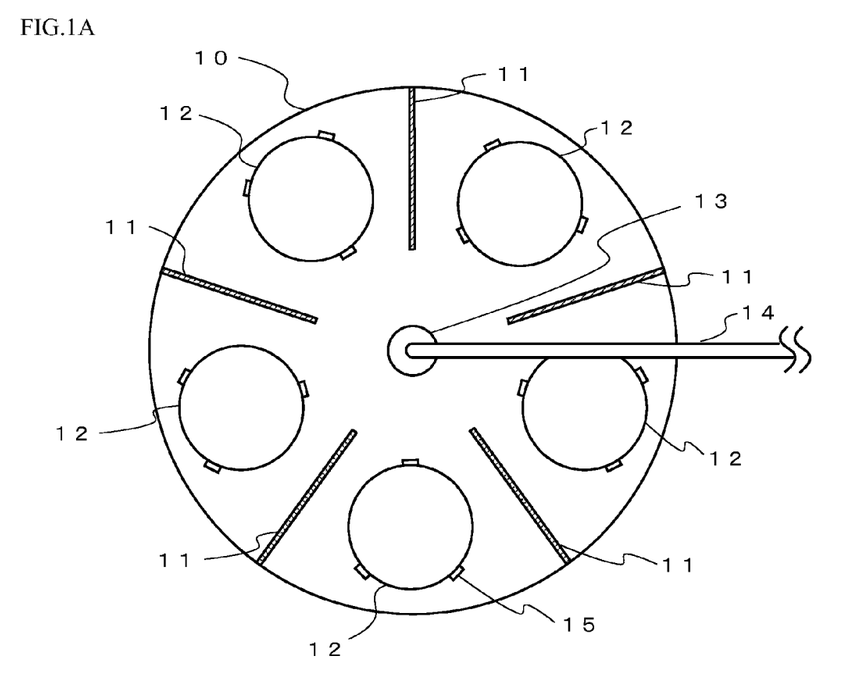
FIGS. 1A and 1B are schematic plan views of a table part of a substrate processing apparatus.
Figure 1B:
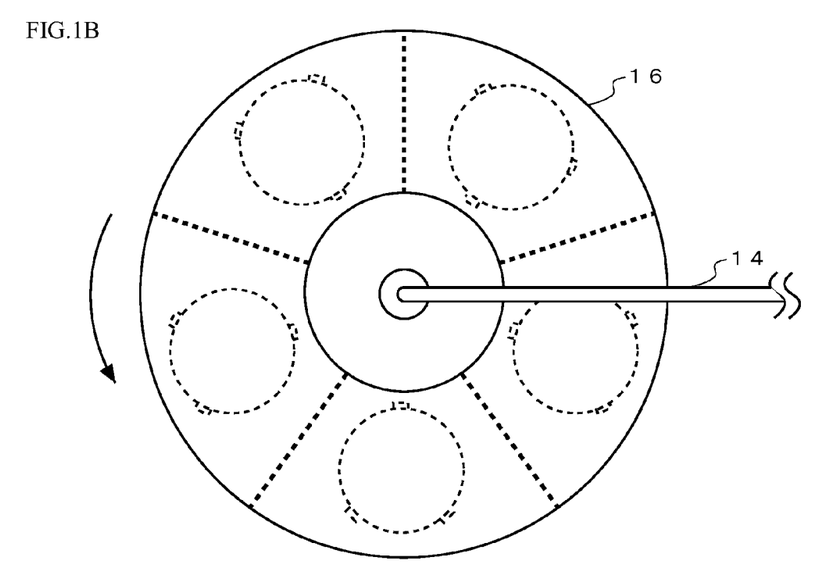

FIGS. 1A and 1B are top views of the table in a case where one surface of the substrate is set as the processing target surface.

Referring to FIG. 1A, at a center portion of a surface of a table 10, a protruding portion 13 having a central axis coincident with a rotational axis of the table 10 is formed so that a top end thereof is directed vertically upward. The protruding portion 13 has a substantially hemispherical shape, and the top end thereof is positioned to be relatively higher than a height from the table 10 to a processing target surface of a substrate 12. On portions of the surface of the table apart from a base end of the protruding portion 13 in a table outer peripheral direction by a predetermined distance, there are provided as many substrate support mechanisms as the number of substrates 12 being subjected to processing at one time at the same distance from the top end of the protruding portion 13. In the example of FIG. 1A, five substrate support mechanisms are provided. The respective substrate support mechanisms are provided at such positions that relative positions of the supporting substrates 12 (for example, center positions thereof) are at the same distance from the top end of the protruding portion 13.

As the substrate support mechanism, there may be used a chuck 15 for supporting three points of an outer peripheral end portion of the substrate 12 from outside under a state in which the processing target surface of the substrate 12 is maintained in a horizontal direction (upward of the drawing sheet). The chuck 15 is connected to a chuck control mechanism (not shown), thereby controlling the opening and closing of the chuck 15. Note that, instead of using the chuck 15 of a type which supports the substrate at three points from outside, by using the chuck 15 merely for positioning, a rear surface with respect to the processing target surface may be supported in a non-contact manner to the surface of the table 10 by Bernoulli suction, that is, Bernoulli effect. Further, the substrate 12 may be supported by a well-known vacuum adsorption or electrostatic chuck.

A processing liquid supply port of a nozzle 14, which is connected to a processing liquid supply mechanism (not shown), is positioned so as to be opposed to the top end of the protruding portion 13. With this, the processing liquid is supplied vertically downward from the top end of the protruding portion 13 rotating together with the table 10, and substantially the same amount of the processing liquid reaches at substantially the same time to all of the processing target surfaces of the substrates 12 supported on the surface of the table 10.

Further, on the surface of the table 10, there are formed blocking plates 11 each having a predetermined height, for receiving a flow of the processing liquid or a flow of air routed via the protruding portion 13, while blocking a flow of the processing liquid or a flow of air routed via a substrate 12 supported by an adjacent chuck 15. The blocking plate 11 has a length equal to or larger than the diameter of the substrate 12, and a height capable of blocking interference of the processing liquid to the other chucks 15. There are provided at least the same number of blocking plates 11 as the chucks 15, and the blocking plates 11 are each formed in a space between the adjacent chucks 15 radially (in a straight line or a curved line) from the base end of the protruding portion 13 in the outer peripheral direction of the table 10.

Outer end portions (end portions provided upward of the drawing sheet of FIG. 1A) of the respective blocking plates 11 are parallel to the processing target surface of the substrate 12, and are covered with a top plate 16 formed into a doughnut shape in which the vicinity of the protruding portion 13 is cut out. FIG. 1B illustrates a state of the table 10 covered with the top plate 16. With this top plate 16, it is possible to prevent particles and a mist from adhering to the processing target surfaces.

Note that, FIG. 1B illustrates an example in which the outer diameter of the top plate 16 is equal to the diameter of the table 10, but the top plate 16 is only required to have a form which enables the adjacent blocking plates 11 to be provided as side walls, and hence the shape and the size thereof may be arbitrarily designed.

Each of the blocking plates 11, the top plate 16, and other electrifiable members are preferred to be formed of a conductive member held at a ground potential. With this, it is possible to prevent electrification during substrate processing.

When the table 10 structured as described above is rotated in the horizontal direction, the blocking plates 11 produce a blower effect like a radial fan onto the table 10. That is, air taken in from an opening portion in the vicinity of the protruding portion 13 passes through a space formed by inner walls of the adjacent blocking plates 11 and an inner wall of the top plate 16, to thereby generate a flow heading toward the outer peripheral end portion of the table 10 on the surface of the table 10. As a result, the processing liquid supplied to the top end of the protruding portion 13 is greatly forced to move outside the table 10 by the blower effect in addition to the centrifugal force generated by rotating the table 10.

When an equivalent force to forcibly cause the processing liquid to flow is attempted to be applied to the processing liquid in a table free from the blocking plates 11 and the top plate 16, it is necessary to increase the rotating speed or bear a cost of, for example, table reinforcement because of high-speed rotation. However, in the structure of this embodiment, those requirements are unnecessary.

Figure 2:
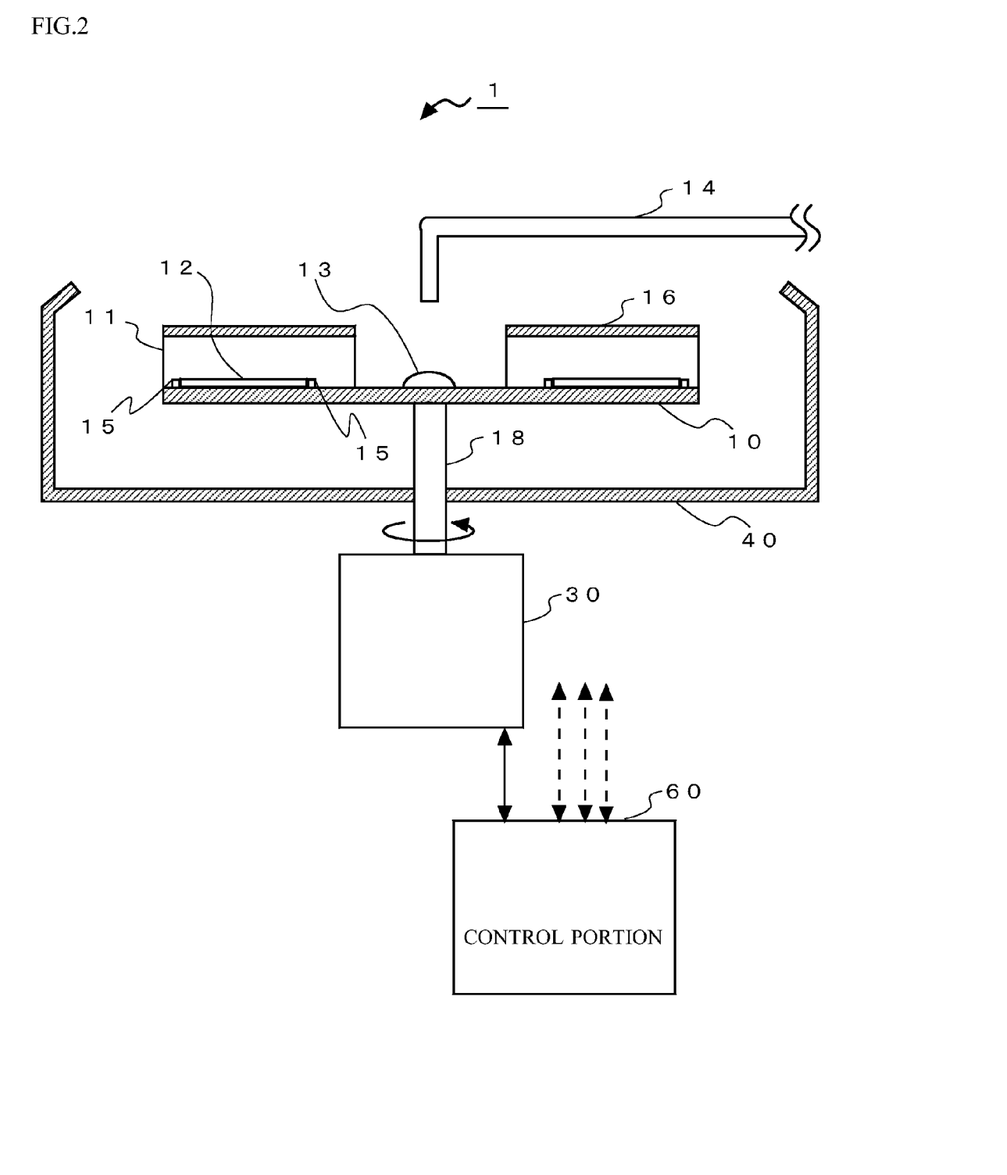
FIG. 2 is a schematic vertical sectional view of a substrate processing apparatus according to a first embodiment of the present invention.

FIG. 2 is a schematic vertical sectional view illustrating a structural example of a peripheral member of a substrate processing apparatus 1 including the above-mentioned table 10. The substrate processing apparatus 1 illustrated in FIG. 2 mainly includes a motor 30 for rotating the table 10, a cover portion 40 for preventing the processing liquid from scattering, and a control portion 60 including a computer for controlling the motor 30, the processing liquid supply mechanism (not shown), and the chuck control mechanism (not shown).

The control portion 60 performs positioning of the nozzle 14, control of start or stop of the processing liquid supply from the nozzle 14, control of supply amount per unit time of the processing liquid jetted and supplied from the nozzle 14, control of opening and closing of the chuck 15 and support pressure of the substrate 12, control of start or stop of actuation of the motor 30, and the like. The rotative force of the motor 30 controlled by the control portion 60 is transmitted to the table 10 via a drive portion 18. In this manner, the table 10 rotates or stops its rotation. The control procedure performed by the control portion 60 is described later.

Under a state in which the rotating speed of the table 10 has reached a predetermined value by the control of the control portion 60, the processing liquid is supplied from the nozzle 14 vertically downward to the top end of the protruding portion 13 for a predetermined time period. The processing liquid enters from the vicinity of the protruding portion 13, and reaches the processing target surface of each of the substrates supported on the table 10.

Figure 3:
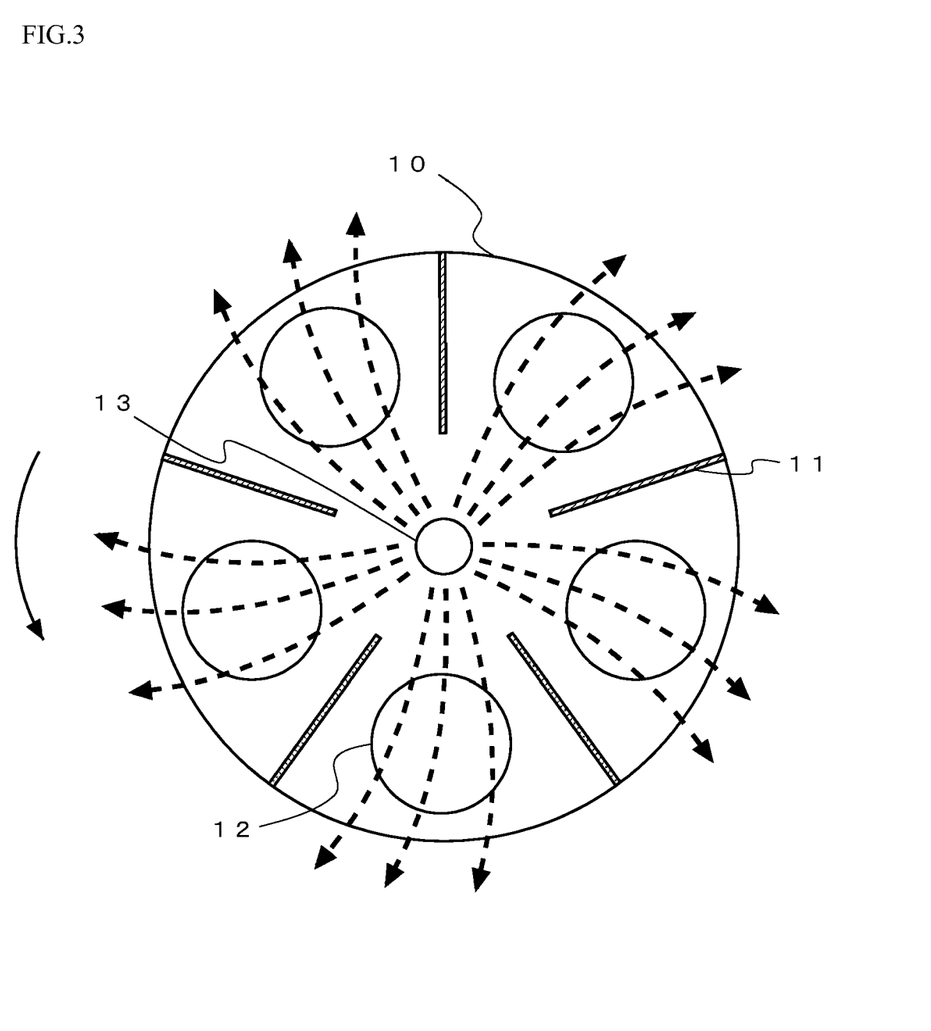
FIG. 3 is a plan view illustrating a diffusing and moving state of a processing liquid, which is forced to flow by centrifugal force.

FIG. 3 is a view schematically illustrating a state of the entered processing liquid moving on the surface of the table 10. The processing liquid is forced to flow by the centrifugal force generated through the rotation of the table 10, and further, by the above-mentioned blower effect, the processing liquid moves on the processing target surface of the substrate 12 while being spread toward the outer peripheral end portion of the table 10. Therefore, even in the vicinity of the surface center portion of the processing target surface of the substrate 12, the processing liquid does not stagnate. FIG. 3 schematically illustrates a diffusing and moving state of the processing liquid, which is forced to flow by the centrifugal force, with gently curved dashed arrows. This curve is set in consideration of a force in the rotating direction generated through the rotation of the table 10, a viscosity of the processing liquid, a supply pressure of the processing liquid, and the like.

Further, the force to be generated by the centrifugal force which enables the processing liquid to forcibly flow on the processing target surface of the substrate 12 is set in consideration of the rotating speed of the table 10, and in addition, the viscosity of the processing liquid, the supply pressure of the processing liquid, an area of the processing target surface of the substrate 12, and the like.

Figure 4:
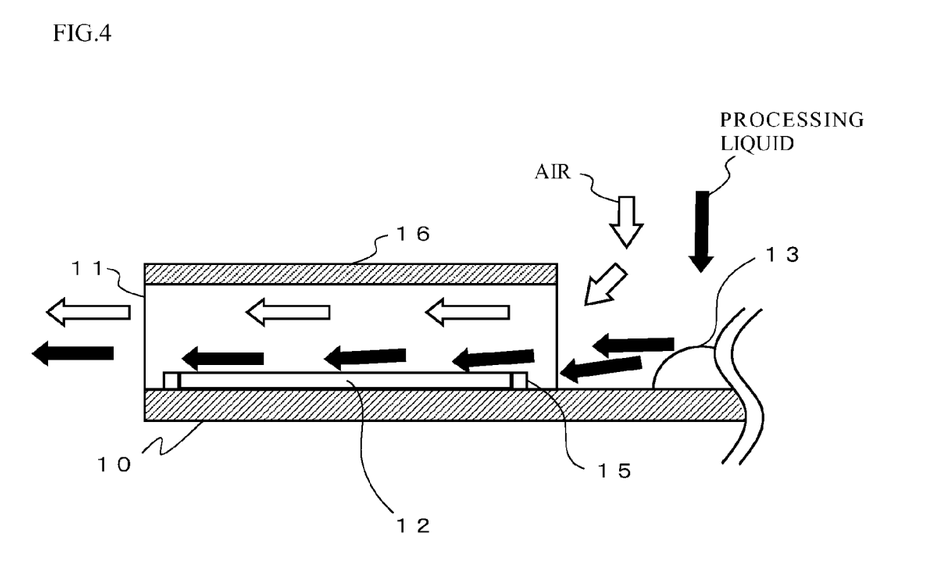
FIG. 4 is a vertical sectional view illustrating the diffusing and moving state of the processing liquid, which is forced to flow by the centrifugal force.

FIG. 4 is a vertical sectional view schematically illustrating a flow of air during the movement of the processing liquid. Along with the rotation of the table 10, the air is taken in from the opening portion in the vicinity of the protruding portion 13 (inner diameter portion of the top plate 16) into a space formed by the table 10, the blocking plates 11, and the top plate 16. The air passes through this space to be discharged from an opening portion in the vicinity of the outer peripheral end portion of the table 10 (outer diameter portion of the top plate 16).

Meanwhile, the processing liquid is forced to flow by the centrifugal force generated through the rotation of the table 10, and reaches the processing target surfaces of the respective substrates 12 supported at the same distance from the top end of the protruding portion 13 at a substantially uniform time. Further, the processing liquid passes on the processing target surface while the force to forcibly cause the processing liquid to flow is increased by the blower effect. Then, the processing liquid is discharged from the opening portion in the vicinity of the outer peripheral end portion of the table 10.

With this, the processing liquid does not stagnate on the processing target surface of the substrate 12, and hence unevenness of the processing liquid is not generated. Thus, uniformity can be attained in the processing results of all of the substrates 12. Further, owing to the synergistic effect of the centrifugal force generated through the rotation and the blower effect, the processing liquid is immediately discharged outside the table 10, and hence the "cutoff" of the processing liquid is improved, which makes it possible to rapidly complete the drying processing. Further, the processing target surfaces of the plurality of substrates 12 are subjected to processing at the same time, and hence it is possible to significantly enhance the work efficiency compared to a case where only one substrate 12 is subjected to processing at a time.

Another Example of Shape of Protruding Portion

Figure 5A:
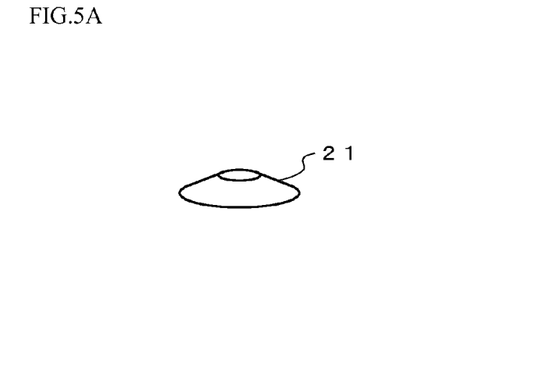
FIG. 5A is an external perspective view illustrating an example of a shape of a protruding portion.

FIG. 5A illustrates another example of the shape of the protruding portion provided to the table 10.

Figure 5B:
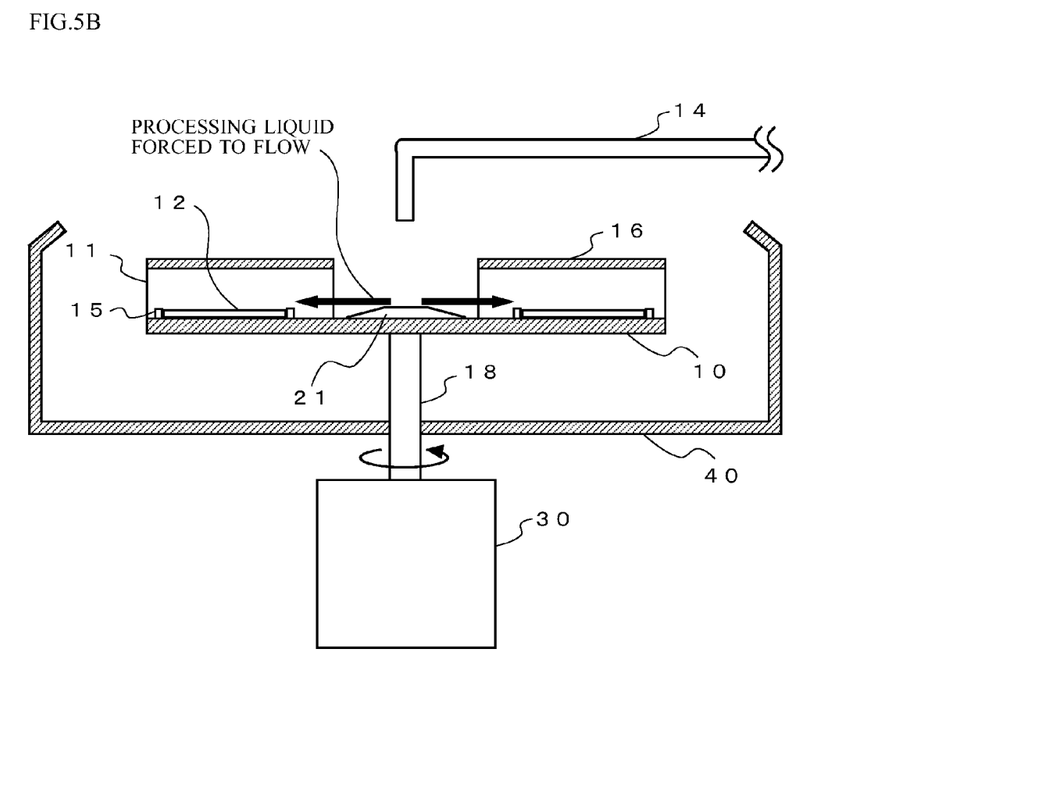
FIG. 5B is a schematic vertical sectional view illustrating a part of the substrate processing apparatus at which the protruding portion is formed.

A protruding portion 21 illustrated in FIG. 5A has a substantially conical shape having, at a top end thereof, a plane portion parallel to a table surface, that is, parallel to the processing target surface of the substrate 12. The protruding portion 21 is designed so that the height from a base end to the top end thereof is equal to or slightly larger than the thickness of the substrate 12. FIG. 5B is a schematic vertical sectional view illustrating the substrate processing apparatus 1 including the protruding portion 21 shaped as described above.

Unlike the protruding portion 13 having a substantially hemispherical shape as described above at the top end thereof, the protruding portion 21 shaped as described above has a flat surface of a predetermined area formed parallel to the table 10. Hence, the processing liquid supplied from the nozzle 14 is spread in a direction parallel to the table 10 at the top end of the protruding portion 21, and under this state, the processing liquid is forced to flow by the centrifugal force generated through the rotation of the table 10. As a result, the processing liquid moves substantially parallel to the table 10 while being spread toward the outer peripheral end portion of the table 10, and hence the processing liquid can be supplied more uniformly with respect to the five substrates 12. Further, the processing liquid moves on a surface inclined toward the base end of the protruding portion 21, and hence when the processing liquid separates from the inclined surface of the protruding portion 21, owing to the force of gravity, supply pressure of the processing liquid, and the like, a force directed toward the table 10 also acts so that the processing liquid moves downward from the separation point on the inclined surface of the protruding portion 21. As a result, the processing liquid heading toward the processing target surface of the substrate 12 is prevented from being scattered.

Further, when the processing liquid reaches the processing target surface of the substrate 12 with a certain approaching angle, there is a case where the processing liquid is scattered back at the processing target surface of the substrate 12, and in some cases, for example, the processing liquid thus scattered back becomes a mist in a particle containing state to adhere to the processing target surface of the substrate 12 again. With the protruding portion 21 having a shape as illustrated in FIG. 5A, it is possible to cause the processing liquid supplied to the top end to reach the processing target surface of the substrate 12 under a state in which the processing liquid is forced to flow substantially parallel to the processing target surface of the substrate 12, and hence the processing liquid can be prevented from being scattered back. As a result, it is possible to suppress generation of a mist containing particles and the like.

Further, even when the thickness of the substrate 12 changes, it is possible to support the substrate 12 thus changed in thickness by changing the height of the protruding portion 21.

Control Procedure for Substrate Processing

Figure 6:
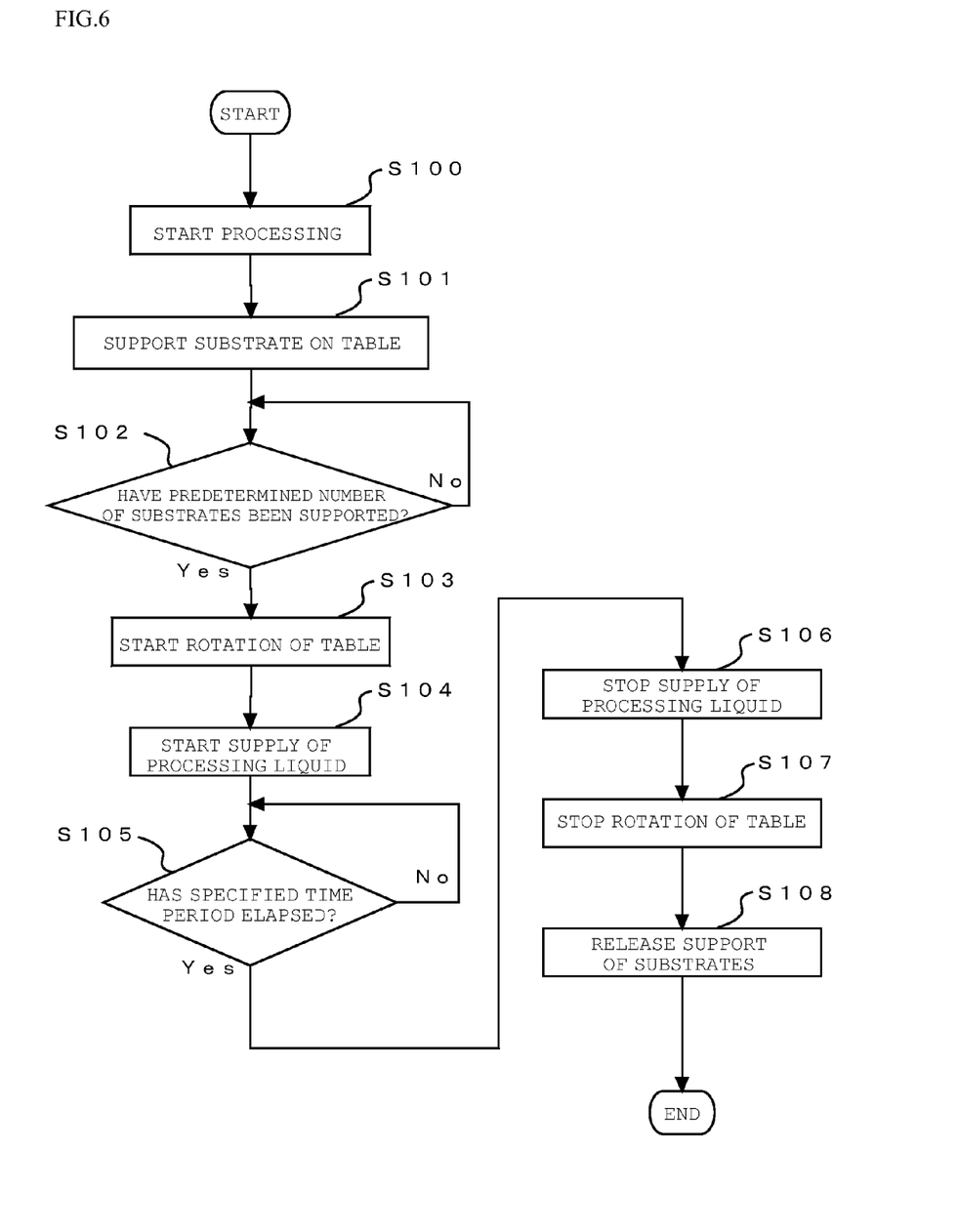
FIG. 6 is an explanatory flow chart illustrating an overall procedure of a substrate processing method to be executed in the substrate processing apparatus.

FIG. 6 is an explanatory flow chart illustrating a substrate processing method performed by the substrate processing apparatus 1 according to this embodiment, particularly, a main control procedure performed by the control portion 60.

The control portion 60 starts the control when receiving input of an instruction to start the substrate processing from an operator operating the substrate processing apparatus 1 (Step S100). After predetermined initial processing, the chuck control mechanism is activated to horizontally support the substrate 12 at a predetermined part of the table 10 (Step S101). The control portion 60 confirms whether or not a predetermined number of substrates to be subjected to processing at one time have been supported with actuation of the chuck control mechanism, and when it is confirmed that the substrates have been supported (Step S102: Yes), the control portion 60 issues an instruction to the motor 30 so as to start the rotation of the table 10 (Step S103). With this, the table 10 starts its rotation horizontally.

When a timer (not shown) detects that a specified time period (first time period) has elapsed after the instruction to start the rotation of the table 10 is issued, the control portion 60 issues, to the processing liquid supply mechanism, an instruction for positioning of the nozzle 14 and an instruction to start supply of the processing liquid (Step S104). With this, the processing liquid is supplied from the nozzle 14 toward the protruding portion 13 of the table 10.

When the timer detects that a specified time period (second time period) has elapsed after the instruction to start the supply of the processing liquid is issued, the control portion 60 issues an instruction to the processing liquid supply mechanism so as to stop the supply of the processing liquid (Step S105: Yes). With the supply stop of the processing liquid (Step S106), only air flows onto the processing target surface of the substrate 12 on the table 10, and thus the remaining processing liquid is removed outside the table 10. In this manner, the drying processing is performed.

When the timer detects that a further specified time period (third time period) has elapsed, the control portion 60 issues an instruction to stop the motor 30 so as to stop the rotation of the table 10 (Step S107). When it is detected that the motor 30 has stopped, the control portion 60 issues an instruction to the chuck control mechanism so as to release the support of the substrates 12 (Step S108). With this, the surface processing of the substrates 12 is completed.

As described above, in the substrate processing apparatus 1, the processing liquid reaches the processing target surface of the substrate 12 via the protruding portion 13 at the center portion of the surface of the table 10 which rotates in the horizontal direction, under a state of being forced to flow by the centrifugal force and the like. Therefore, in all parts including the vicinity of the center portion of the processing target surface of each of the substrates 12, substantially the same amount of the processing liquid can be caused to move at substantially the same speed. Therefore, uniformity can be attained in substrate processing results of all of the plurality of substrates 12. Further, it is possible to simplify the condition settings necessary for uniformity of the substrate processing. Further, the plurality of processing target surfaces of the respective substrates 12 can be subjected to processing at the same time in one surface processing control, and hence it is also possible to improve efficiency of processing time period required for each substrate.

Further, with the blocking plates 11, an air flow is generated on the surface of the table 10, and hence the processing liquid, which is forced to flow by the centrifugal force, is also forced to flow by the blower effect, to thereby enable the processing liquid to more smoothly move on the processing target surface of the substrate 12 without stagnating on a part of the processing target surface. After the supply of the processing liquid is stopped, the processing target surface can be rapidly dried with the air flow.

Further, the respective substrates 12 are supported in independent spaces defined by the table 10, the top plate 16, and the blocking plates 11, and the processing is carried out by integrally rotating the table 10 and the top plate 16 via the blocking plates 11. Therefore, for example, it is possible to prevent the spent processing liquids respectively used for processing of the supported adjacent substrates 12 from adhering to the adjacent substrates again, or to prevent the particles from adhering to the processing target surfaces after the substrate processing.

Second Embodiment

Next, description is given of an example of a case where both surfaces (front surface and rear surface) of the substrate are set as the processing target surface.

Figure 7:
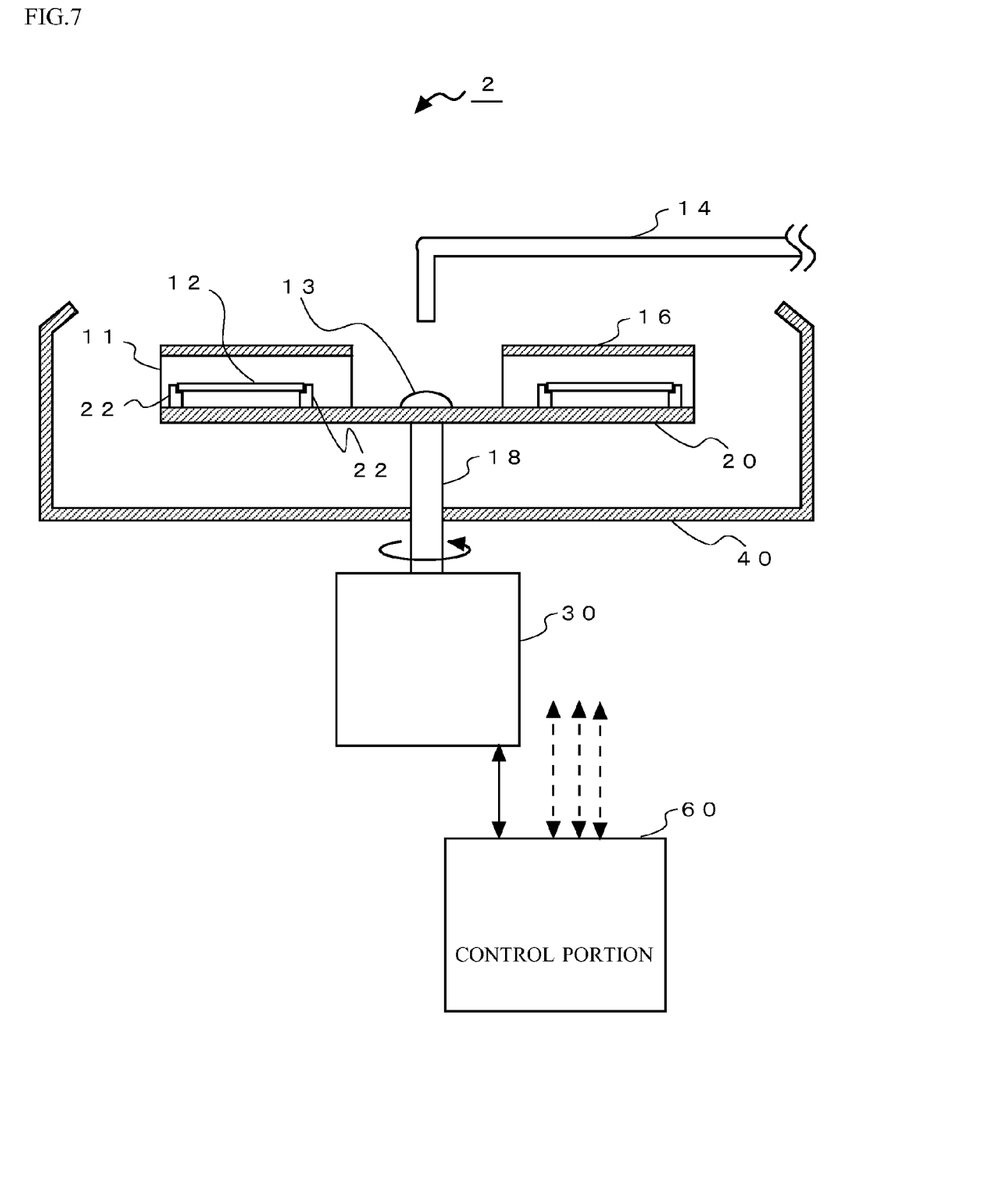
FIG. 7 is a schematic vertical sectional view of a substrate processing apparatus according to a second embodiment of the present invention.

FIG. 7 is a schematic vertical sectional view illustrating a structural example of a substrate processing apparatus according to a second embodiment of the present invention, and mainly illustrates a distinguishing part. Components overlapping with those described in the first embodiment are denoted by the same reference numerals, and overlapping description thereof is omitted.

A substrate processing apparatus 2 described in this embodiment includes a table 20 having, as the substrate support mechanism, as many sets of edge clamps 22 as the number of the substrates 12 to be subjected to processing at one time.

The edge clamp 22 is a member, which is held in contact with the peripheral edge portion of the substrate 12, for supporting the substrate 12 onto the table 20 and for supporting the processing target surface of the substrate 12 in a non-contact state with respect to each of the table 20 and the top plate 16. The edge clamp 22 may employ, for example, a three point chuck method which is capable of supporting the substrate 12 at a substantially intermediate position between the table 20 and the top plate 16. Further, a well-known adsorption device utilizing the Bernoulli effect may be used together with the edge clamp 22 so that the substrate 12 is stably supported by the table 20 in a floating state.

Figure 8:
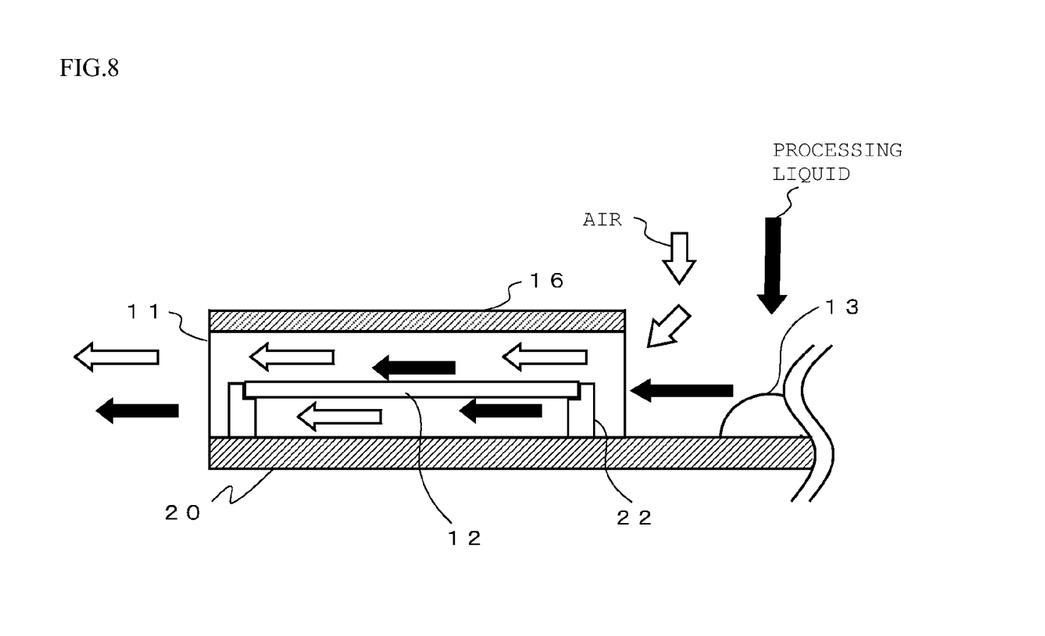
FIG. 8 is a schematic vertical sectional view illustrating a diffusing and moving state of a processing liquid, which is forced to flow by centrifugal force, in the second embodiment.

FIG. 8 is a schematic vertical sectional view illustrating states of an air flow generated by rotating the table 20 of this embodiment, in which the blocking plates 11 are provided, and the movement of the processing liquid supplied to the top end of the protruding portion 13 and forced to flow by the centrifugal force of the rotating table 20 in a case where the air flow and the movement of the processing liquid are viewed from the side surface side of the table 20. As illustrated in FIG. 8, along with the rotation of the table 20, the air is taken in from the opening portion in the vicinity of the protruding portion 13 (inner diameter portion of the top plate 16). The air passes through spaces on the table 20 side and the top plate 16 side of the substrate 12 supported on the table 20 to be discharged from the opening portion in the vicinity of the outer peripheral end portion of the table 20 (outer diameter portion of the top plate 16).

Meanwhile, the processing liquid is forced to flow by the centrifugal force generated through the rotation of the table 20, and reaches the substrates 12 supported at the same distance from the top end of the protruding portion 13 at a substantially uniform time. Then, the processing liquid is separated into a flow which moves while contacting the processing target surface (first surface) of the substrate 12, which is opposed to the top plate 16, and a flow which moves while contacting the processing target surface (second surface) of the substrate 12, which is opposed to the table 20. Each flow passes on each of the processing target surfaces while the force to forcibly cause the processing liquid to flow is increased by the blower effect. Then, the processing liquid is discharged from the opening portion in the vicinity of the outer peripheral end portion of the table 20.

With this, similarly to the case of the first embodiment, the processing liquid does not stagnate on the processing target surface of the substrate 12, and hence unevenness of the processing liquid is not generated. Thus, uniformity can be attained in the processing results of all of the substrates 12. Further, owing to the synergistic effect of the centrifugal force generated through the rotation and the blower effect, the processing liquid is immediately discharged outside the table 20, and hence the "cutoff" of the processing liquid is improved, which makes it possible to rapidly complete the drying processing. Further, the processing target surfaces of the plurality of substrates 12 are subjected to processing at the same time, and hence it is possible to significantly enhance the work efficiency compared to the case where only one substrate 12 is subjected to processing at a time.

Another Example of Shape of Protruding Portion in Second Embodiment

Figure 9A:
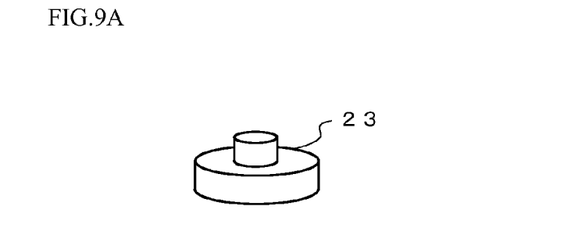
FIG. 9A is an external perspective view illustrating an example of a shape of a protruding portion in the second embodiment.
Figure 9B:
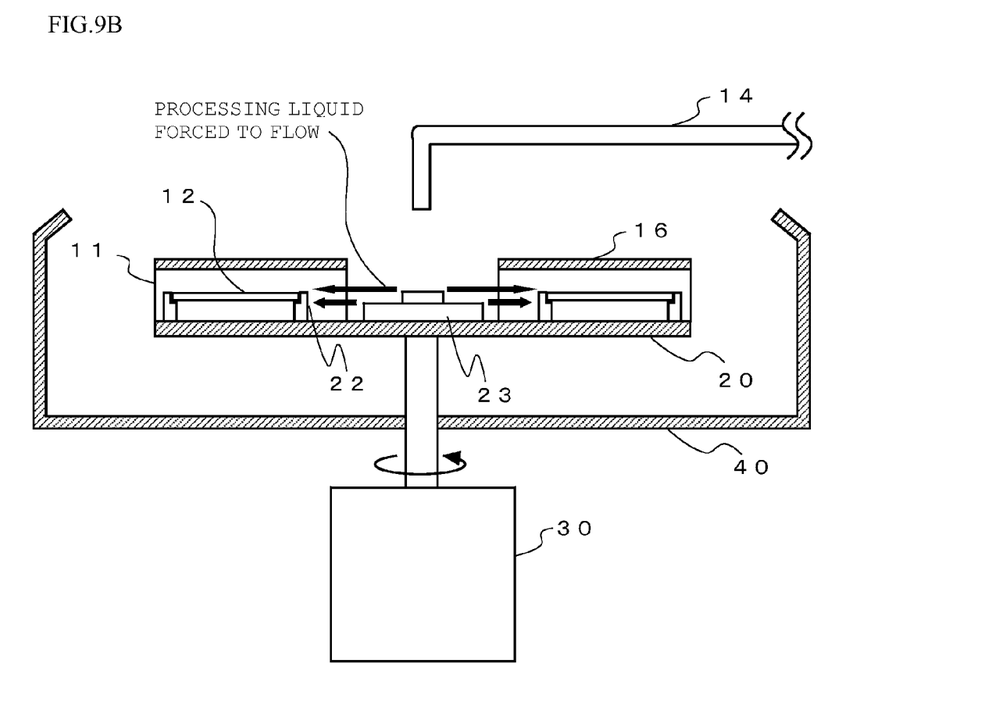
FIG. 9B is a schematic vertical sectional view illustrating a part of the substrate processing apparatus at which the protruding portion is formed.

FIG. 9A illustrates another example of the shape of the protruding portion provided to the table 20. A protruding portion 23 is formed of two columns, which have different diameters and central axes coincident with each other under a state in which the column having the larger diameter is positioned below. FIG. 9B is a schematic vertical sectional view of the substrate processing apparatus 2 including the protruding portion 23. In the protruding portion 23, there are formed a plane of an upper base portion of the column having the smaller diameter and a plane of an upper base portion of the column having the larger diameter excluding a part overlapping with the column having the smaller diameter. For the sake of convenience, the former plane is referred to as a first plane portion, and the latter plane is referred to as a second plane portion. The protruding portion 23 is formed on the rotational axis at the center portion of the surface of the table 20 so that the first plane portion and the second plane portion are each formed so as to be parallel to the surface of the table 20 and have predetermined areas. Therefore, the processing liquid supplied from the nozzle 14 toward the first plane portion of the protruding portion 23 is spread in a direction parallel to the table 20 at the first plane portion by a supply pressure of the processing liquid and the like. Under this state, the processing liquid is forced to flow by the centrifugal force generated through the rotation of the table 20, and hence the processing liquid moves substantially parallel to the table 20 while being spread toward the peripheral edge portion of the table 20.

Then, the processing liquid supplied from the nozzle 14 toward the first plane portion of the protruding portion 23 reaches the second plane portion as well. The processing liquid is spread in a direction parallel to the table 20 at the second plane portion. Under this state, the processing liquid is forced to flow by the centrifugal force generated through the rotation of the table 20, and hence the processing liquid moves substantially parallel to the table 20 while being spread toward the outer peripheral end portion of the table 20.

In the second embodiment, a distance from the table 20 to the first plane portion of the protruding portion 23 is set to be the same as a distance from the table 20 to the processing target surface of the substrate 12, which is opposed to the top plate 16. Further, a distance from the table 20 to the second plane portion of the protruding portion 23 is set to be the same as a distance from the table 20 to the processing target surface of the substrate 12, which is opposed to the table 20. In this manner, the processing liquid is supplied to the top end of the protruding portion 23, and then the processing liquid, which is forced to flow, is caused to reach each of the processing target surfaces of the substrate 12 in a manner substantially parallel thereto. With this, it is possible to move the processing liquid in a manner contacting with each of the processing target surfaces of the substrates 12 while suppressing the processing liquid from being scattered back. As a result, it is possible to suppress generation of a mist containing particles and the like described in the first embodiment.

Further, the above-mentioned processing may even support the case where the thickness of the substrate 12 changes, that is, the case where the distance from the table 20 to each of the processing target surfaces of the substrate 12 changes, by adjusting the distance from the table 20 to the first plane portion or the second plane portion.

Example in which Protruding Portion Ascends and Descends

Figure 10A:
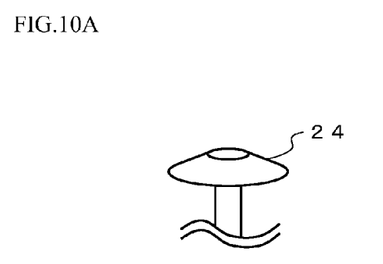
FIG. 10A is an external perspective view illustrating another example of the shape of the protruding portion in the second embodiment.
Figure 10B:
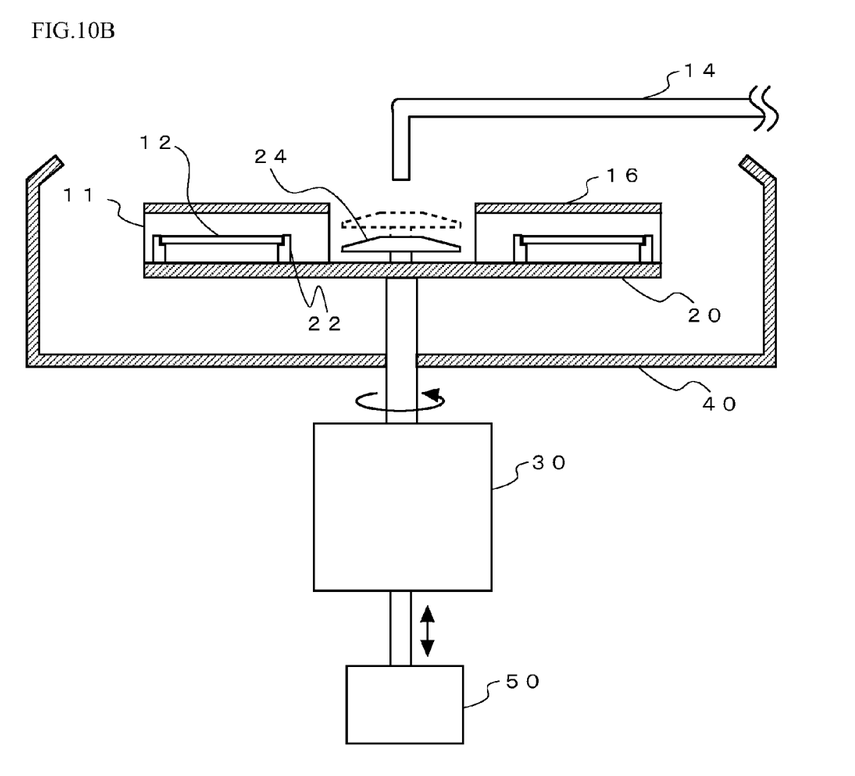
FIG. 10B is a schematic vertical sectional view illustrating a part of the substrate processing apparatus at which the protruding portion is formed.

FIGS. 10A and 10B illustrate an example of the protruding portion, which is structured so as to be capable of freely ascending and descending relatively to the table 20. The protruding portion of this embodiment is a protruding portion 24 formed into a substantially umbrella shape as illustrated in FIG. 10A. FIG. 10B is a schematic vertical sectional view of the substrate processing apparatus 2 including the protruding portion 24.

The protruding portion 24 is connected to an actuator 50 to be controlled by the control portion 60, and is formed so as to be capable of freely ascending and descending relatively to the table 20. With the actuation of the actuator 50, the protruding portion 24 ascends or descends relatively to the table 20, to thereby change a distance from the table 20 to the top end of the protruding portion 24 in a constant cycle.

The protruding portion 24 is formed so that a central axis of an umbrella portion at the top end is the same as the rotational axis of the table 20, and the top end has a flat surface of a predetermined area formed parallel to the table 20. Therefore, the processing liquid supplied from the nozzle 14 toward the top end of the protruding portion 24 is spread in a direction parallel to the table 20 at the top end by a supply pressure of the processing liquid and the like, and under this state, the processing liquid is forced to flow by the centrifugal force generated through the rotation of the table 20. As a result, the processing liquid moves substantially parallel to the table 20 while being spread toward the peripheral edge portion of the table 20.

In this case, the processing liquid is supplied while the protruding portion 24 repeatedly ascends and descends in a range including a range from a position at which the distance from the table 20 to the top end of the protruding portion 24 is the same as the distance from the table 20 to the processing target surface of the substrate 12, which is opposed to the top plate 16, to a position at which the distance from the table 20 to the top end of the protruding portion 24 is the same as the distance from the table 20 to the processing target surface of the substrate 12, which is opposed to the table 20. In this manner, it is possible to cause the processing liquid, which is forced to flow, to reach each of the processing target surfaces of the substrate 12 in a manner substantially parallel thereto in a predetermined cycle. Therefore, even when the thickness of the substrate 12 changes, it is possible to easily support the substrate 12 thus changed in thickness by adjusting the ascending and descending range of the protruding portion 24. Therefore, it is possible to flexibly adjust the moving state of the processing liquid, which is forced to flow.

Note that, even when the table 20 is formed to be capable of freely ascending and descending relatively to the protruding portion 24, it is possible to obtain effects similar to those obtained in the case where the protruding portion 24 ascends and descends.

As described above, according to the substrate processing apparatus 2 of the second embodiment, in addition to the effects obtained in the substrate processing apparatus 1 of the first embodiment, processing with respect to the processing target surfaces on both sides of the substrate 12 can be performed in one control. Therefore, efficient processing is possible when two-surface processing is performed in, for example, substrate cleaning processing and substrate etching processing.

Modified Examples (1) In the substrate processing apparatus 1 of the first embodiment and the substrate processing apparatus 2 of the second embodiment, with the rotation of the table 10 or 20, air is taken in from the opening portion in the vicinity of the protruding portion 13 (23, 24) (inner diameter portion of the top plate 16), passes through spaces on the table 10 or 20 side and the top plate 16 side of the substrate 12 supported on the table 10 or 20, and is discharged from the opening portion in the vicinity of the outer peripheral end portion of the table 10 or 20 (outer diameter portion of the top plate 16). Alternatively, a nitrogen or clean dry air (CDA) gas may be blown from the opening portion at the inner diameter portion of the top plate 16, to thereby generate a nitrogen atmosphere or a CDA atmosphere in the space surrounded by the inner walls of the blocking plates 11, the inner wall of the top plate 16, and the surface of the table 20.

(2) The top plate 16 used in the substrate processing apparatuses 1 and 2 may be formed into a mesh form by punching the top plate 16 to obtain a large number of small holes and the processing liquid may be supplied from an upper portion of the top plate 16. In this manner, it becomes possible to substantially vertically and directly supply the processing liquid to the processing target surface of the substrate 12. With this, even when it is necessary to perform processing with the use of the processing liquid without rotating the table 10 or 20 in the substrate processing steps, there is no need to detach the top plate 16 in each case, and hence efficient processing is possible.

DRAWINGS

FIG. 2
60 CONTROL PORTION
FIG. 4
(1) AIR
(2) PROCESSING LIQUID
FIG. 5B
PROCESSING LIQUID FORCED TO FLOW
FIG. 6
S100 START PROCESSING
S101 SUPPORT SUBSTRATE ON TABLE
S102 HAVE PREDETERMINED NUMBER OF SUBSTRATES BEEN SUPPORTED?
S103 START ROTATION OF TABLE
S104 START SUPPLY OF PROCESSING LIQUID
S105 HAS SPECIFIED TIME PERIOD ELAPSED?
S106 STOP SUPPLY OF PROCESSING LIQUID
S107 STOP ROTATION OF TABLE
S108 RELEASE SUPPORT OF SUBSTRATES
FIG. 7
60 CONTROL PORTION
FIG. 8
(1) AIR
(2) PROCESSING LIQUID
FIG. 9B
PROCESSING LIQUID FORCED TO FLOW

What is claimed is:

1. A substrate processing apparatus, comprising:
a table, which rotates in parallel to a processing target surface of a substrate under a state in which the processing target surface is supported horizontally, the table having the processing target surface provided thereon, toward which a predetermined processing liquid is supplied;
a protruding portion, which is formed at a center portion of a surface of the table and has a central axis coincident with a rotational axis of the table; and
a plurality of substrate support mechanisms, which are formed on portions of the surface of the table spaced apart from a base end of the protruding portion in an outer peripheral direction of the table by a predetermined distance, for supporting the substrate so that the processing target surface thereof is held horizontally, the plurality of substrate support mechanisms being provided at the same distance from a top end of the protruding portion,
wherein the predetermined processing liquid, which is supplied vertically downward toward the top end of the protruding portion rotating together with the table, is forced to flow by centrifugal force generated through rotation of the table via the top end of the protruding portion, to thereby cause the predetermined processing liquid to reach processing target surfaces of all of substrates supported by the plurality of substrate support mechanisms, the processing target surfaces including vicinity of center portions of the substrates,
further comprising blocking plates, which are formed on the surface of the table, for receiving one of a flow of the predetermined processing liquid and a flow of air routed via the protruding portion, while blocking one of a flow of the predetermined processing liquid and a flow of air routed via one of adjacent one of the plurality of substrate support mechanisms and a substrate supported by the adjacent one of the plurality of substrate support mechanisms, and
further comprising a top plate, which is opposed in parallel to the processing target surfaces of the substrates supported by the plurality of substrate support mechanisms each provided between adjacent blocking plates, the top plate being provided on outer end portions of the adjacent blocking plates.

2. A substrate processing apparatus according to claim 1, wherein each of the plurality of substrate support mechanisms supports a rear surface with respect to the processing target surface of the substrate in a non-contact manner to the table by Bernoulli effect.

3. A substrate processing apparatus according to claim 1, wherein:
the blocking plates comprise at least the same number of blocking plates as the plurality of substrate support mechanisms; and
the blocking plates are each formed in a space between adjacent ones of the plurality of substrate support mechanisms, and formed radially from the base end of the protruding portion in the outer peripheral direction of the table.

4. A substrate processing apparatus according to claim 1, wherein the top plate is formed into a mesh form to supply the predetermined processing liquid to the opposing processing target surfaces via the top plate.

5. A substrate processing apparatus according to claim 1 or 4, wherein each of the top plate and the blocking plates comprises a conductive member held at a ground potential.

6. A substrate processing apparatus according to claim 1 or 2, further comprising protruding portion elevating means for causing a position of the top end of the protruding portion to move on the rotational axis of the table so that the protruding portion freely ascends and descends.

7. A substrate processing apparatus, comprising: a table, which rotates in parallel to a processing target surface of a substrate under a state in which the processing target surface is supported horizontally, the table having the processing target surface provided thereon, toward which a predetermined processing liquid is supplied;
- a protruding portion, which is formed at a center portion of a surface of the table and has a central axis coincident with a rotational axis of the table; and
- a plurality of substrate support mechanisms, which are formed on portions of the surface of the table spaced apart from a base end of the protruding portion in an outer peripheral direction of the table by a predetermined distance, for supporting the substrate so that the processing target surface thereof is held horizontally, the plurality of substrate support mechanisms being provided at the same distance from a top end of the protruding portion,
- wherein the predetermined processing liquid, which is supplied vertically downward toward the top end of the protruding portion rotating together with the table, is forced to flow by centrifugal force generated through rotation of the table via the top end of the protruding portion, to thereby cause the predetermined processing liquid to reach processing target surfaces of all of substrates supported by the plurality of substrate support mechanisms, the processing target surfaces including vicinity of center portions of the substrates, further comprising blocking plates, which are formed on the surface of the table, for receiving one of a flow of the predetermined processing liquid and a flow of air routed via the protruding portion, while blocking one of a flow of the predetermined processing liquid and a flow of air routed via one of adjacent one of the plurality of substrate support mechanisms and a substrate supported by the adjacent one of the plurality of substrate support mechanisms, and further comprising a top plate, which is opposed in parallel to the processing target surfaces of the substrates supported by the plurality of substrate support mechanisms each provided between adjacent blocking plates, the top plate being provided on outer end portions of the adjacent blocking plates, and wherein the top plate is formed into a mesh form.

8. A substrate processing apparatus according to claim 1, wherein the top plate and the blocking plates are mounted to rotate with the table.

9. A substrate processing apparatus according to claim 7, wherein the top plate and the blocking plates are mounted to rotate with the table.

* * * * *